United States Patent [19]

Chai

[11] 4,355,196
[45] Oct. 19, 1982

[54] SOLAR CELL HAVING IMPROVED BACK SURFACE REFLECTOR

[75] Inventor: An-Ti Chai, North Ridgeville, Ohio

[73] Assignee: The United States of America as represented by the Administrator of the National Aeronautics and Space Administration, Washington, D.C.

[21] Appl. No.: 242,796

[22] Filed: Mar. 11, 1981

[51] Int. Cl.$^3$ ................ H01L 31/04; H01L 31/18
[52] U.S. Cl. ................... 136/259; 29/572; 136/256; 357/30; 427/88; 427/89; 427/90; 427/91
[58] Field of Search ............ 136/256, 259, 253; 357/30; 29/572, 589, 590; 427/88–91

[56] References Cited

U.S. PATENT DOCUMENTS

| | | | |
|---|---|---|---|
| Re. 29,833 | 11/1978 | Mlavsky | 136/246 |
| 2,001,672 | 5/1935 | Carpenter | 338/17 |
| 3,532,551 | 10/1970 | Webb | 136/246 |
| 3,988,167 | 10/1976 | Kressel et al. | 136/256 |
| 3,989,541 | 11/1976 | Brandhorst, Jr. | 136/256 |

Primary Examiner—Aaron Weisstuch
Attorney, Agent, or Firm—Norman T. Musial; John R. Manning; Gene E. Shook

[57] ABSTRACT

This invention is concerned with reducing the operating temperature and increasing the output of a solar cell.

A solar cell (10) constructed in accordance with the invention carries electrodes (22) in a grid finger pattern on its back surface (12). These electrodes are sintered at the proper temperature to provide good ohmic contact. After sintering, a reflective material (24) is deposited on the back surface by vacuum evaporation. Thus, the application of the back surface reflector is separate from the back contact formation.

Back surface reflectors formed in conjunction with separate grid finger configuration back contacts are more effective than those formed by full back metallization of the reflector material.

6 Claims, 2 Drawing Figures

SOLAR CELL HAVING IMPROVED BACK SURFACE REFLECTOR

DESCRIPTION

ORIGIN OF THE INVENTION

The invention described herein was made by an employee of the United States Government and may be manufactured and used by or for the Government for governmental purposes without the payment of any royalties thereon or therefor.

TECHNICAL FIELD

This invention is concerned with improving the reflection from the back surface of a solar cell. Back surface reflectors are used on solar cells to reflect the infrared light that would normally be absorbed in the rear contacts. Such absorbed light would subsequently raise the temperature of the cell and thereby reduce the cell voltage.

Back surface reflectors also increase the path length of light in the solar cell. This is especially important in an ultra-thin solar cell.

Certain problems have been encountered in prior art methods of making back surface reflectors because the reflectors also seved as the back electrodes or contacts. Contact metallization was achieved by sintering at low temperatures so that the disruption of the smooth metal-semiconductor interface would be minimized. However, metal electrodes sintered at these low temperatures did not always produce satisfactory ohmic contacts. This resulted in reduced cell output through increased series resistance.

Conversely, when the metallization was achieved by heating at temperatures sufficiently high to obtain a good ohmic contact, the sharp metal-semiconductor interface was disturbed. Thus, the effectiveness of the metallization as a back surface reflector was reduced.

PRIOR ART

Carpenter U.S. Pat. No. 2,001,672 discloses a light sensitive cell which has a top glass plate, photovoltaic cell, and a reflector means. This reflector means comprises a substrate having a reflecting surface.

Webb Pat. No. 3,532,551 describes a solar cell structure which employs a metal reflecting coating in conjunction with the solar cell. The reflecting coating is relied on to substantially decrease the overall operating temperature of the solar cell. This reflecting coating is vacuum-deposited.

Mlavsky reissue U.S. Pat. No. Re 29,833 shows a solar cell assembly which has a silicon tube. An internal metallic coating is provided on the inside surface of the tube to form an ohmic contact. This film consists of a metal or metal alloy having relatively high conductivity and may be gold, nickel, aluminum or copper.

DISCLOSURE OF INVENTION

This invention is concerned with reducing the operating temperature and increasing the current output of a solar cell. The invention is prticularly directed to increasing the output of silicon solar cells by using back surface reflectors with metallized contacts formed by two separate processes.

The back surface of the silicon wafer forming the solar cell carries sintered metal contacts in a grid finger pattern. According to the invention, the application of the back surface reflector to the solar cell is separate from the back contact formation. A metal back surface reflector is applied between the grids after sintering the contacts.

Back surface reflectors formed in conjunction with separate grid finger configuration back contacts are more effective than those formed by full back metallization of the reflector material.

BRIEF DESCRIPTION OF THE DRAWING

The objects, advantages, and novel features of the invention will be more fully apparent from the following detailed description when read in connection with the accompanying drawing wherein.

BEST MODE FOR CARRYING OUT THE INVENTION

Figure 1:
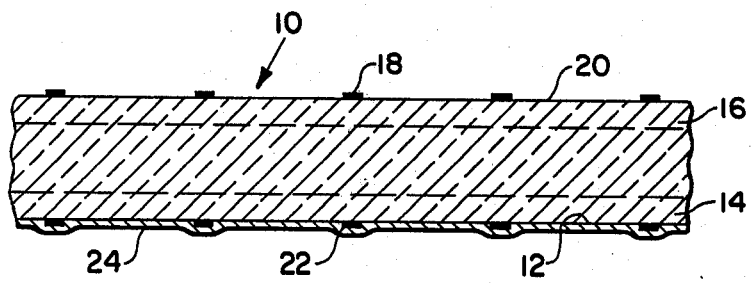
FIG. 1 is an enlarged vertical section view of a solar cell constructed in accordance with the invention.

Referring now to the drawing there is shown in FIG. 1 a solar cell 10 comprising a wafer of P-type material which has been subjected to diffusion of boron into its back or bottom surface 12 to form a back P+ region 14. Diffusion of phosphorous into the opposite face forms a front P-N junction region 16.

A plurality of electrodes 18 are provided on the front or top surface 20. The electrodes 18 are preferably of the grid finger type and contact the front surface 20.

The back surface 12 of the solar cell 10 is highly polished. A plurality of electrodes 22 are in ohmic contact with this back surface 12 as in the case of the electrodes 18 contacting the front surface 20.

The electrodes 18 and 22 are preferably Ti-Pd-Ag or Pd-Ni-Cu. Also other metals suitable for contact metallization may be used. These metals are sintered to provide a good ohmic contact with the respective surfaces 20 and 12 of the solar cell 10.

A back surface reflector 24 contacts the surface 12 in the space between the electrodes 22. The back surface reflector 24 can be aluminum, copper, gold, silver, or other suitable material. It has been found that aluminum which is typically used is actually inferior to any of the listed metals insofar as infrared reflectivity is concerned.

Ultra-thin solar cells 10 having a thickness of about 50 $\mu$m were produced in accordance with the invention. Each cell measured 2 centimeters by 2 centimeters. The back surface 12 of each cell was polished to a mirror finish.

Electrodes 18 and 22 were deposited on the front surface 20 and back surface 12, respectively, after the back surface was polished and the diffusion processes were completed. These electrodes were in the form of a grid having eighteen contact fingers on the back and eighteen on the front. These electrodes were sintered at a temperature high enough to insure good ohmic contact between the electrodes and the surfaces of the solar cell 10. By way of example, the Ti-Pd-Ag electrodes are sintered at about 400° C. for the front surface grid 18 and between about 550° C. to 600° C. for the back surface grid 22. Pd-Ni-Cu electrodes can be sintered at about 300° C. for both the front and the back grids.

After the contacts 18 and 22 had been deposited and sintered the back surface 12 and electrodes 22 were covered with the back surface reflector 24. The reflector material was deposited by vacuum evaporation to a thickness of about 1500 A. No additional sintering of the reflector layer was done. The reflector is usually different from the contact material.

Certain types of solar cells, such as inter-digitated back contact cells, have all the collecting electrodes or contacts on the back side. Such cells have no collecting contacts or electrodes on the front. This invention applies to that configuration as well.

DESCRIPTION OF AN ALTERNATE EMBODIMENT

Figure 2:
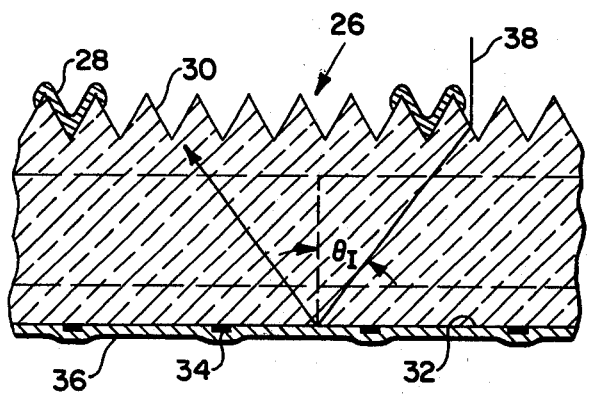
FIG. 2 is an alternate embodiment of a solar cell constructed in accordance with the invention.

Referring now to FIG. 2, there is shown a solar cell 26 having electrodes 28 on a textured front surface 30. Except for the textured front surface, the solar cell 26 is similar to the cell 10 shown in FIG. 1 in that it has a polished back surface 32 which contacts electrodes 34. No metal need cover the back surface 32 in the space between the electrodes 34; however, a back surface reflector 36 is used in some applications. The electrodes 34 are formed in the same manner as the electrodes 22 in FIG. 1. More particularly, a grid of metal fingers is placed over the back surface 32. These fingers are sintered at a temperature adequate to insure good ohmic contact between the electrodes 34 and the back surface 32 as explained above.

As a light ray 38 is cast on the silicon solar cell 26 normal to the textured front surface 30, it enters the crystal at an angle through the side of a pyramid as shown in FIG. 2. Refraction causes the light ray 38 to bend, resulting in its having an incident angle $\theta_I$ greater than the critical angle at the back surface 32. Therefore, total reflection takes place, and the bare polished back surface serves as the most effective reflector. No additionl reflector material need be deposited on the back surface when the front surface is textured to obtain reflection because the total internal reflection provides the best possible reflector.

It may be necessary to provide a back surface reflector 36 on a solar cell 26 having a textured front surface 30 to improve the heat sinking characteristics. Also, in high concentration applications where large currents are generated, metal back surface reflectors can aid in carrying these large currents away from the cell.

In order to better illustrate the improved characteristics of cells constructed in accordance with the invention, a number of different cells were prepared by various techniques. The average value of the integrated spectral absorptance for each type of cell was determined and listed in the Table.

TABLE

| Sample | Metal back surface reflector | Average spectral absorptance, | |
|---|---|---|---|
| | | Without metal BSR | With metal BSR |
| A | Al | | 0.683 ± 0.001 |
| B | None | 0.786 ± 0.003 | |
| C | Al | 0.791 ± 0 | 0.672 ± 0.004 |
| D | Ag | 0.785 ± 0.005 | 0.639 ± 0.005 |
| E | Au | 0.785 ± 0.002 | 0.638 ± 0.001 |
| F | Cu | 0.791 ± 0.003 | 0.643 ± 0.001 |
| G | Al | | 0.899 ± 0.007 |
| H | None | 0.895 ± 0.002 | |
| I | None | 0.899 ± 0.003 | |
| J | Al | 0.902 | 0.907 |
| K | Ag | 0.893 | 0.895 |
| L | Au | 0.895 | 0.899 |
| M | Cu | 0.889 | 0.892 |

The thickness of each cell was nominally 50 μm, and the smoothness of the polished back surface was preserved by using gaseous boron diffusion to form the back surface field 14. A mirror-like back surface finish was preserved for all the cells except the areas directly under the sintered metal contacts 22 and 34. As explained above, the mirror finish could not be preserved on cells with full back contacts due to the sintering process.

Both planar and textured front surface cells were fabricated and tested. All the cells were coated with a multiple layer antireflection coating.

Each sample contained cells with full back contacts and cells with grid finger back contacts. Each grid finger rear contact had twelve fingers per 2- by 2- cm cell. One set of cells was prepared with twenty grid fingers.

The cells in sample A had planar front surfaces and full back contacts with aluminum back surface reflectors formed under low temperature sintering. Sample A comprised baseline cells of typical 50 μm thick space quality cells. The back surface reflectors and back contacts were formed under optimum low heat treatment conditions.

The cells in sample B had planar front surfaces and line finger back contacts of twelve grid fingers. This sample comprised control cells with no metal back surface reflectors. These cells provided a basis for comparison for the other cells.

The cells in samples C,D,E and F had planar front surfaces as shown in FIG. 1. These cells also had line finger back contacts 22, each having twelve grid fingers. Each sample had a different metal in its back surface reflector. Average spectral absorptances were determined both before and after the deposition of the metal reflectors 24.

The cells in sample G had textured front surfaces and full back contacts with aluminum back surface reflectors formed under low temperature sintering. These were baseline cells similar to sample A with different front surface configurations.

The cells in samples H and I were similar to those in sample B in that they comprised control cells with no metal back surface reflectors. These cells had textured front surfaces and line finger back contacts as shown in FIG. 2. The back contact of each sample H cell formed a twelve finger grid, and for each sample I cell it formed a twenty finger grid.

The cells in samples J,K,L, and M are of the type shown in FIG. 2. These cells had textured front surfaces with double line finger back contacts. Each back contact was in the form of a grid with twenty fingers. Each sample had back surface reflectors of a different metal.

Sample C shows that a gridded rear contact covered with an aluminum back surface reflector reduces the absorptance of a planar surface cell from 0.791 to 0.672. A comparison of the data for samples A and B indicates the absorptance is reduced to by 0.683 with an aluminum back surface reflector formed by low heat sintering. This shows the improved results achieved by avoiding heat sintering in back surface reflector formation.

Back surface reflectors of gold, silver, or copper reduce the absorptance even more. A reduction in absorptance of 0.148 for sample F corresponds to a reduction in cell operating temperature in space of 15° C.

Samples H to M show that with textured front surface cells, the polished bare surfaces on the back sides of such cells provide the best reflectors. The addition of an extra reflector of any metal for any purpose, such as heat removal, serves to reduce the effectiveness of such a device by a small amount. However, this slight penalty may be worth paying in certain applications to achieve improved heat sinking characteristics or to provide cells for high concentration applications.

While several embodiments of the invention have been shown and described, it will be apparent that various modifications may be made without departing from the spirit of the invention or the scope of the subjoined claims.

I claim:

1. In a method of making a solar cell of the type having a back surface reflector, the improvement comprising depositing a plurality of electrodes comprising a first metal material in a grid finger pattern on the back surface of said solar cell, sintering said grid finger pattern of electrodes to provide good ohmic contact with said back surface, and applying a second, different metal reflective material to said back surface in the spaces between the grid fingers forming the electrodes to form said back surface reflector.

2. A method as claimed in claim 1 including the step of selecting the reflective material of a metal from the group consisting of aluminum, copper, gold, and silver.

3. A method as claimed in claim 2 wherein the selected metal is applied by vacuum evaporation.

4. A method as claimed in claim 3 wherein the reflective metal is vacuum evaporated to a thickness of about 1500 Angstrom units.

5. A method as claimed in claim 1 including the step of polishing the back surface prior to depositing the electrodes thereon.

6. In a solar cell of the type comprising a wafer of photovoltaic material having a front surface for receiving light and an oppositely disposed back surface, the improvement comprising a plurality of electrodes of a first metal material having a finger pattern in good ohmic contact with said back surface, and a layer of a second different metal reflective material covering said back surface in the spaces between said electrodes thereby forming a back surface reflector.

* * * * *